United States Patent
Choi et al.

(10) Patent No.: US 12,159,859 B2
(45) Date of Patent: Dec. 3, 2024

(54) THERMAL PAD, SEMICONDUCTOR CHIP INCLUDING THE SAME AND METHOD OF MANUFACTURING THE SEMICONDUCTOR CHIP

(71) Applicant: SAMSUNG ELECTRONICS CO., LTD., Suwon-si (KR)

(72) Inventors: Jimin Choi, Seoul (KR); Jeonil Lee, Suwon-si (KR); Jongmin Lee, Hwaseong-si (KR); Juik Lee, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 135 days.

(21) Appl. No.: 17/696,989

(22) Filed: Mar. 17, 2022

(65) Prior Publication Data
US 2023/0078980 A1   Mar. 16, 2023

(30) Foreign Application Priority Data
Sep. 14, 2021   (KR) .......................... 10-2021-0122236

(51) Int. Cl.
*H01L 25/065*   (2023.01)
*H01L 23/367*   (2006.01)
(Continued)

(52) U.S. Cl.
CPC ........ *H01L 25/0657* (2013.01); *H01L 23/367* (2013.01); *H01L 23/42* (2013.01); *H01L 23/481* (2013.01)

(58) Field of Classification Search
CPC ............. H01L 21/822; H01L 21/76898; H01L 21/76895; H01L 23/367; H01L 23/42; H01L 23/481; H01L 23/5283; H01L 23/5226; H01L 23/528; H01L 23/5329; H01L 23/53266; H01L 24/02; H01L 24/05; H01L 24/16; H01L 25/0657; H01L 2023/4037; H01L 2023/405; H01L 2023/4075–4087; H01L 2224/16148; H01L 2224/0557;
(Continued)

(56) References Cited

U.S. PATENT DOCUMENTS

| 8,314,483 | B2 | 11/2012 | Lin et al. |
| 9,515,002 | B2 | 12/2016 | Gandhi et al. |

(Continued)

FOREIGN PATENT DOCUMENTS

KR   10-1142336 B1   5/2012

*Primary Examiner* — Amir A Jalali
(74) *Attorney, Agent, or Firm* — Fish & Richardson P.C.

(57) ABSTRACT

A thermal pad of a semiconductor chip, a semiconductor chip including the thermal pad, and a method of manufacturing the semiconductor chip, the thermal pad including a thermal core in a trench at a lower surface of a semiconductor substrate, the thermal core being configured to receive heat generated from a through silicon via (TSV) vertically extending through the semiconductor substrate; a thermal head connected to the thermal core and protruding from the lower surface of the semiconductor substrate, the thermal head being configured to dissipate the heat in the thermal core; a first insulation layer between an inner surface of the trench and the thermal core; and a second insulation layer between the first insulation layer and the thermal core.

9 Claims, 18 Drawing Sheets

(51) Int. Cl.
  *H01L 23/42*   (2006.01)
  *H01L 23/48*   (2006.01)
(58) Field of Classification Search
  CPC ............... H01L 2224/05583–05584; H01L
      2225/06513; H01L 2225/06541; H01L
      2225/06517; H01L 2225/06544; H05K
      7/2039; H05K 7/30454; H05K 7/20463;
      H05K 7/20472; H05K 7/205; H05K
      7/2089–209
  See application file for complete search history.

(56) References Cited

U.S. PATENT DOCUMENTS

| | | |
|---|---|---|
| 9,768,147 B2 | 9/2017 | Gandhi et al. |
| 9,805,977 B1* | 10/2017 | Sukumaran ....... H01L 21/76898 |
| 9,875,992 B2 | 1/2018 | Heo et al. |
| 10,461,014 B2 | 10/2019 | Lin et al. |
| 2009/0102021 A1* | 4/2009 | Chen .................. H01L 21/6835 |
| | | 257/621 |
| 2009/0160058 A1* | 6/2009 | Kuo ........................ H01L 24/11 |
| | | 257/E23.145 |
| 2011/0244676 A1* | 10/2011 | Chen ................. H01L 21/76898 |
| | | 438/643 |
| 2012/0292782 A1* | 11/2012 | Lee ....................... H01L 23/481 |
| | | 257/774 |
| 2013/0264720 A1* | 10/2013 | Chun ............... H01L 21/76898 |
| | | 257/774 |
| 2014/0035164 A1* | 2/2014 | Moon .............. H01L 21/76898 |
| | | 257/774 |
| 2014/0264911 A1* | 9/2014 | Lin ....................... H01L 23/535 |
| | | 257/774 |
| 2015/0115431 A1* | 4/2015 | Chadwick ............. H10N 10/01 |
| | | 438/122 |
| 2016/0181174 A1* | 6/2016 | Gambino ............. H01L 23/481 |
| | | 438/666 |
| 2017/0200675 A1* | 7/2017 | Jung ................. H01L 23/53295 |
| 2020/0161221 A1* | 5/2020 | Kang .................... H01L 23/481 |
| 2021/0167182 A1* | 6/2021 | Sung ..................... H01L 29/785 |
| 2023/0187300 A1* | 6/2023 | Geiger ................ H01L 27/0211 |
| | | 257/713 |

* cited by examiner

THERMAL PAD, SEMICONDUCTOR CHIP INCLUDING THE SAME AND METHOD OF MANUFACTURING THE SEMICONDUCTOR CHIP

CROSS-REFERENCE TO RELATED APPLICATION

This application claims priority under 35 USC § 119 to Korean Patent Application No. 10-2021-0122236, filed on Sep. 14, 2021, in the Korean Intellectual Property Office (KIPO), the contents of which are herein incorporated by reference in their entirety.

BACKGROUND

1. Field

Embodiments relate to a thermal pad, a semiconductor chip including the same, and a method of manufacturing the semiconductor chip.

2. Description of the Related Art

In a semiconductor package including a plurality of stacked semiconductor chips, the semiconductor chips may be electrically connected with each other via a through silicon via (TSV). The TSV may vertically extend through the semiconductor chip to electrically make contact with other TSVs of other semiconductor chips.

SUMMARY

The embodiments may be realized by providing a thermal pad of a semiconductor chip, the thermal pad including a thermal core in a trench at a lower surface of a semiconductor substrate, the thermal core being configured to receive heat generated from a through silicon via (TSV) vertically extending through the semiconductor substrate; a thermal head connected to the thermal core and protruding from the lower surface of the semiconductor substrate, the thermal head being configured to dissipate the heat in the thermal core; a first insulation layer between an inner surface of the trench and the thermal core; and a second insulation layer between the first insulation layer and the thermal core.

The embodiments may be realized by providing a semiconductor chip including a semiconductor substrate including a trench at a lower surface thereof; a through silicon via (TSV) vertically extending through the semiconductor substrate; a thermal core in the trench, the thermal core being configured to receive heat generated from the TSV; a thermal head connected to the thermal core and protruding from the lower surface of the semiconductor substrate, the thermal head being configured to dissipate the heat in the thermal core; a first insulation layer between an inner surface of the trench and the thermal core; and a second insulation layer between the first insulation layer and the thermal core.

The embodiments may be realized by providing a method of manufacturing a semiconductor chip, the method including providing a semiconductor substrate including a through silicon via (TSV) therein; forming a trench at a lower surface of the semiconductor substrate and adjacent to the TSV; sequentially forming a first insulation layer and a second insulation layer on the lower surface of the semiconductor substrate and an inner surface of the trench; forming a conductive layer on the second insulation layer to fill the trench with the conductive layer; removing a portion of the conductive layer until a portion of the second insulation layer at the lower surface of the semiconductor substrate is exposed to form a thermal core in the trench; forming a seed layer on the thermal core and the TSV; and forming a thermal head connected to the thermal core and a head portion connected to the TSV from the seed layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
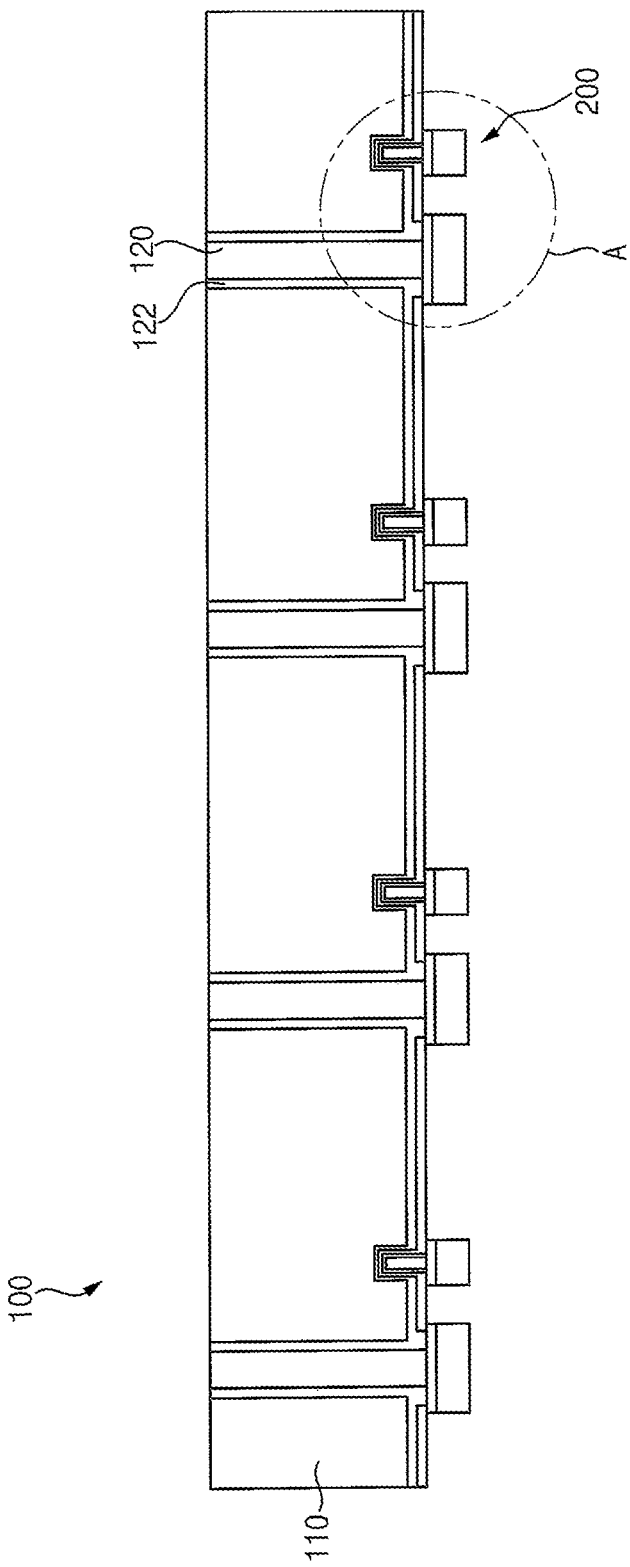
FIG. 1 is a cross-sectional view of a semiconductor chip in accordance with example embodiments.
Figure 2:
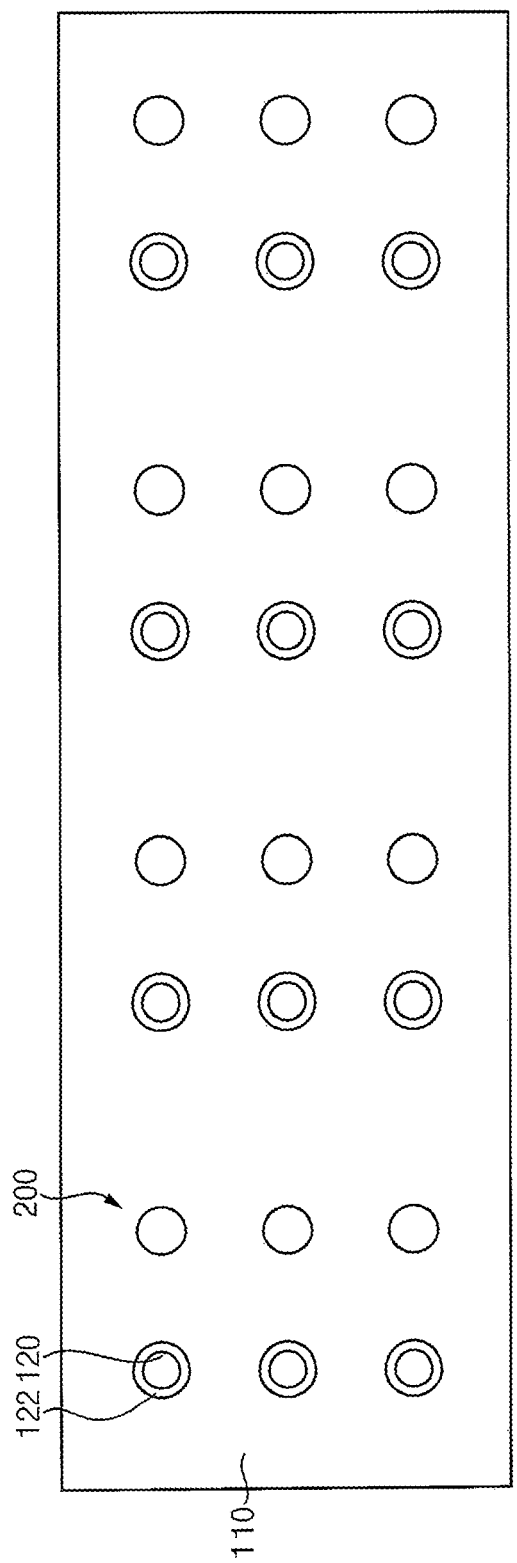
FIG. 2 is a bottom view of the semiconductor chip in FIG. 1.
Figure 3:
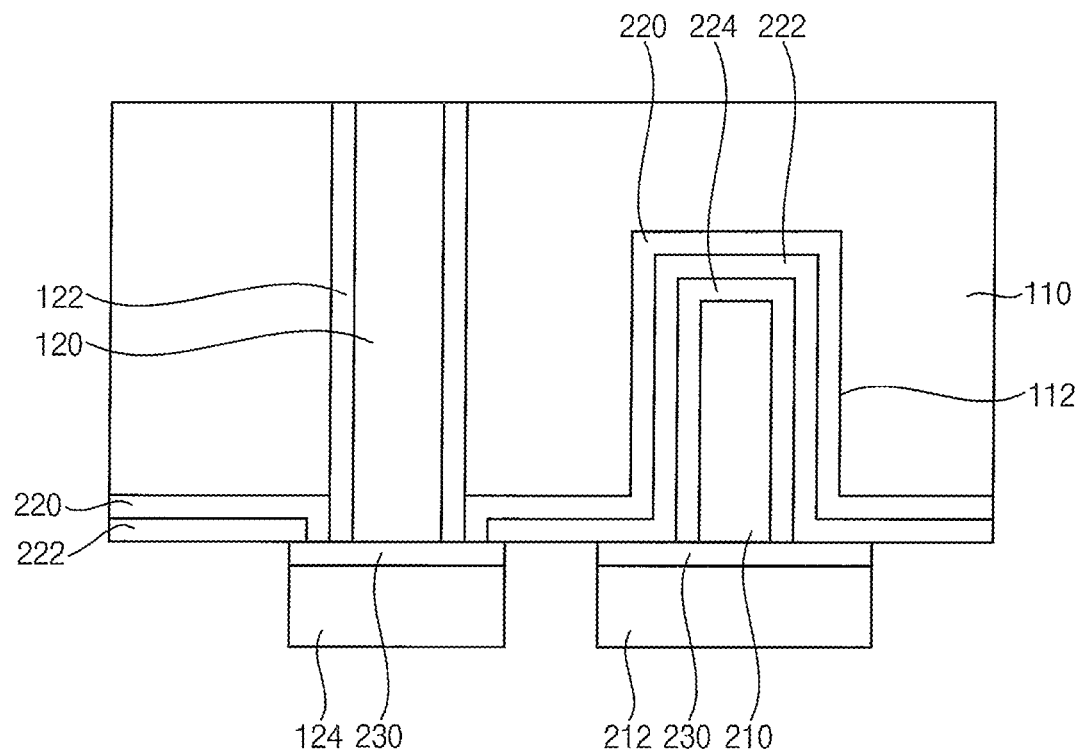
FIG. 3 is an enlarged cross-sectional view of a portion "A" in FIG. 1.

FIG. 1 is a cross-sectional view of a semiconductor chip in accordance with example embodiments, FIG. 2 is a bottom view of the semiconductor chip in FIG. 1 and FIG. 3 is an enlarged cross-sectional view of a portion "A" in FIG. 1.

Referring to FIGS. 1 to 3, a semiconductor chip 100 according to an embodiment may include a semiconductor substrate 110, a plurality of TSVs 120, and a plurality of thermal pads 200. A plurality of the semiconductor chips 100 may be stacked. The stacked semiconductor chips 100 may be electrically connected with each other via the TSVs 120 and conductive bumps.

In an implementation, the semiconductor substrate 110 may include, e.g., a silicon substrate. Circuits may be formed in the semiconductor substrate 110. The semiconductor substrate 110 may include a plurality of trenches 112 therein. The trenches 112 may upwardly (e.g., inwardly) extend from a lower surface of the semiconductor substrate 110 in a vertical direction.

The TSVs 120 may electrically connect the stacked semiconductor chips 100 with each other. Each of the TSVs 120 may vertically extend through the semiconductor substrate 110. Each of the TSVs 120 may have an upper end exposed through or at an upper surface of the semiconductor substrate 110. Each of the TSVs 120 may have a lower end exposed through or at the lower surface of the semiconductor substrate 110. Each of the TSVs 120 may be surrounded by an insulation layer 122. In an implementation, the insulation layer 122 may surround a side surface, the upper end, and the lower end of the TSV 120. In an implementation, the insulation layer 122 may surround the entire outer surface of the TSV 120. In an implementation, the insulation layer 122 may include, e.g., an oxide.

In an implementation, each of the TSVs 120 may include a head portion 124 and a seed layer 230 thereon. The head portion 124 may be on the lower end of the TSV 120. The head portion 124 may protrude (e.g., outwardly) from the lower surface of the semiconductor substrate 110. In an implementation, a side surface and a lower surface of the head portion 124 may be exposed. In an implementation, the head portion 124 may have a width wider than a width of the TSV 120. In an implementation, the width of the head portion 124 may be substantially equal to or less than the width of the TSV 120. The TSV 120 may include a conductive material, e.g., a metal. In an implementation, the TSV 120 may include, e.g., copper.

The seed layer 230 may be between the lower end of the TSV 120 and the head portion 124. The head portion 124 may be formed by a plating process performed on the seed layer 230. In an implementation, the seed layer 230 (e.g., on the TSV 120) may have a width that is substantially the same as the width of the head portion 124.

An electrical signal may be transmitted through the TSV 120, which may generate heat from or in the TSV 120. In order to rapidly dissipate the heat from the TSV 120, the thermal pads 200 may be adjacent to each of the TSVs 120. In an implementation, a relatively greater amount of the heat may be generated from or at the lower end of the TSV 120, and the thermal pads 200 may be adjacent to the lower ends of the TSVs 120. In an implementation, each of the thermal pads 200 may include a thermal core 210, a thermal head 212, a first insulation layer 220, a second insulation layer 222, a third insulation layer 224, and the seed layer 230.

The thermal core 210 may be in the trench 112. The thermal core 210 may fully or completely fill the trench 112. In an implementation, the shape of the thermal core 210 may be changed in accordance with a shape of the trench 112. The thermal core 210 may receive the heat generated from the TSV 120. In an implementation, the trench 112 may be in or at a portion of the lower surface of the semiconductor substrate 110 adjacent to the lower end of the TSV 120. In an implementation, the thermal core 210 may include a metal, e.g., copper. The thermal core 210 may enter into or penetrate the semiconductor substrate 110 through or at the lower surface of the semiconductor substrate 110 so that the thermal core 210 may be positioned adjacent to the lower end of the TSV 120. In an implementation, the heat generated from the lower end of the TSV 120 may be rapidly transferred to the thermal core 210.

The thermal head 212 may be at a lower end of the thermal core 210. The thermal head 212 may protrude from the lower surface of the semiconductor substrate 110. In an implementation, a side surface and a lower surface of the thermal head 212 may be exposed. The thermal head 212 may be configured to rapidly dissipate the heat in or from the thermal core 210. In an implementation, the thermal head 212 may have a width wider than a width of the thermal core 210. In an implementation, the width of the thermal head 212 may be no more than the width of the thermal core 210. In an implementation, the thermal head 212 may include a material substantially the same as the material of the thermal core 210. In an implementation, the thermal head 212 may include a metal, e.g., copper. In an implementation, the thermal head 212 may include a material different from the material of the thermal core 210.

The seed layer 230 may be between the thermal core 210 and the thermal head 212. The thermal head 212 may be formed by a plating process performed on the seed layer 230. In an implementation, the seed layer 230 on the thermal core 210 may have a width substantially the same as the width of the thermal head 212. In an implementation, the seed layer 230 of the thermal pad 200 may be formed together with the forming of the seed layer 230 on the TSV 120.

The first insulation layer 220 may have a relatively thin thickness. The first insulation layer 220 may be on the lower surface of the semiconductor substrate 110 and an inner surface of the trench 112. In an implementation, the first insulation layer 220 may be on a side surface and a bottom surface of the trench 112. In an implementation, the first insulation layer 220 may be between the inner surface of the trench 112 and the thermal core 210 to electrically isolate the thermal core 210 from the semiconductor substrate 110. The thermal pad 200 may be a dummy pad to which the electrical signal may not be applied. In an implementation, the first insulation layer 220 on the lower surface of the semiconductor substrate 110 may surround the insulation layer 122 surrounding the lower end of the TSV 120. In an implementation, the first insulation layer 220 may include an insulation material, e.g., an oxide.

The second insulation layer 222 may have a relatively thin thickness. The second insulation layer 222 may be on the first insulation layer 220. In an implementation, the second insulation layer 222 in the trench 112 may be between the first insulation layer 220 and the thermal core 210. The second insulation layer 222 on the lower surface of the semiconductor substrate 110 may also surround the insulation layer 122 surrounding the lower end of the TSV 120. In an implementation, the second insulation layer 222 may include an insulation material, e.g., silicon nitride.

In an implementation, the first insulation layer 220 may reinforce an adhesion force between the second insulation layer 222 and the semiconductor substrate 110. In an implementation, the second insulation layer 222 may act as a stopping layer in a planarization process for manufacturing the semiconductor chip 100 in FIG. 3, described below.

FIGS. 4 to 10 are cross-sectional views of stages in a method of manufacturing the semiconductor chip in FIG. 3. FIGS. 4 to 10 show processes performed on the semiconductor substrate 110 having the lower surface upwardly oriented. Thus, hereinafter, the lower surface of the semiconductor substrate 110 may be referred to as the upper surface of the semiconductor substrate 110.

Figure 4:
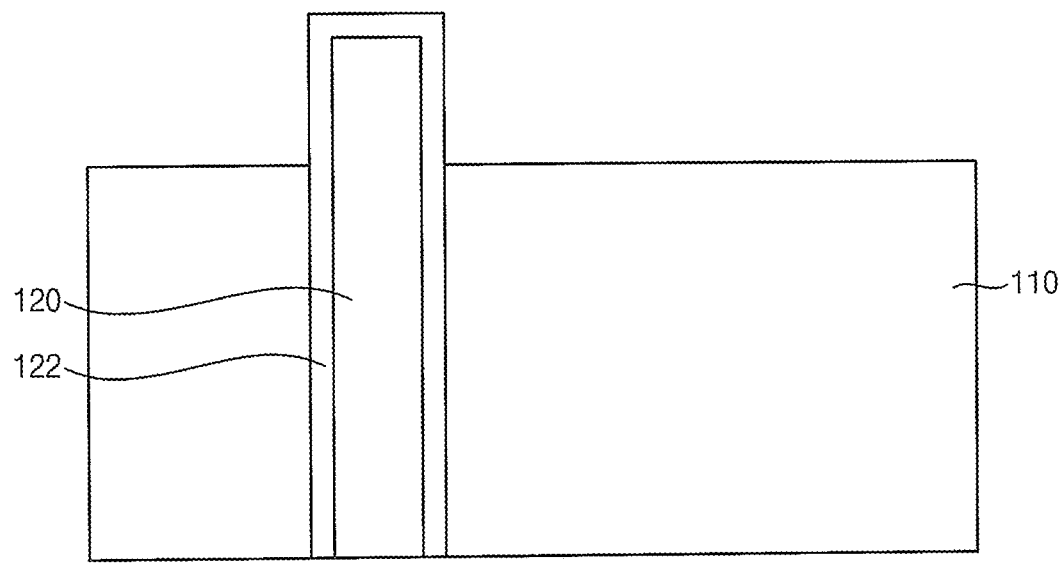
FIGS. 4 to 10 are cross-sectional views of stages in a method of manufacturing the semiconductor chip in FIG. 3.

Referring to FIG. 4, the upper surface of the semiconductor substrate 110 may be partially removed to reduce a thickness of the semiconductor substrate 110. In an implementation, the upper end of the TSV 120 may be exposed through or at the upper surface of the semiconductor substrate 110.

Figure 5:
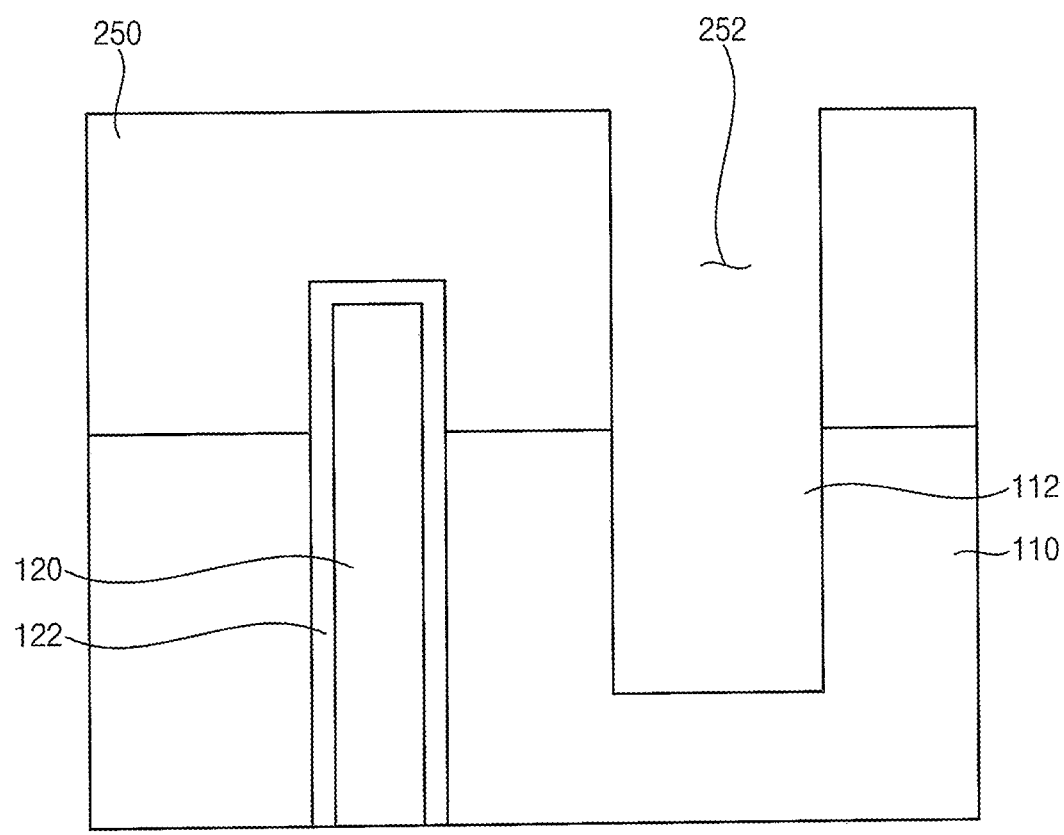

Referring to FIG. 5, a photoresist pattern 250 may be formed on the upper surface of the semiconductor substrate 110. The photoresist pattern 250 may have an opening 252 exposing a portion of the surface of the semiconductor substrate 110 adjacent to the TSV 120.

The surface of the semiconductor substrate 110 may be etched using the photoresist pattern 250 as an etch mask to form the trench 112 in the semiconductor substrate 110.

Figure 6:
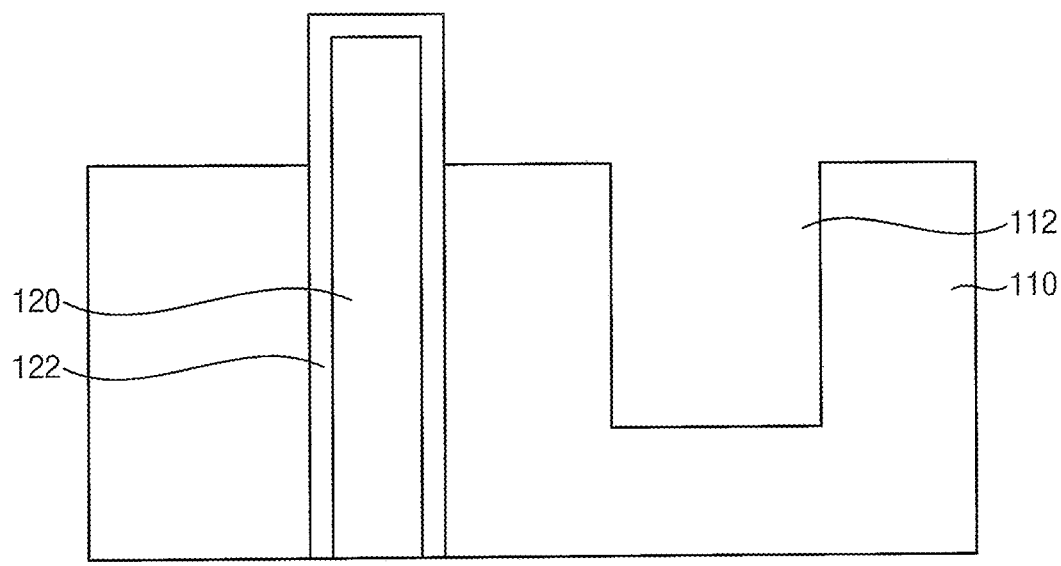

Referring to FIG. 6, the photoresist pattern 250 may then be removed. In an implementation, the photoresist pattern 250 may be removed by a stripping process or an ashing process.

Figure 7:
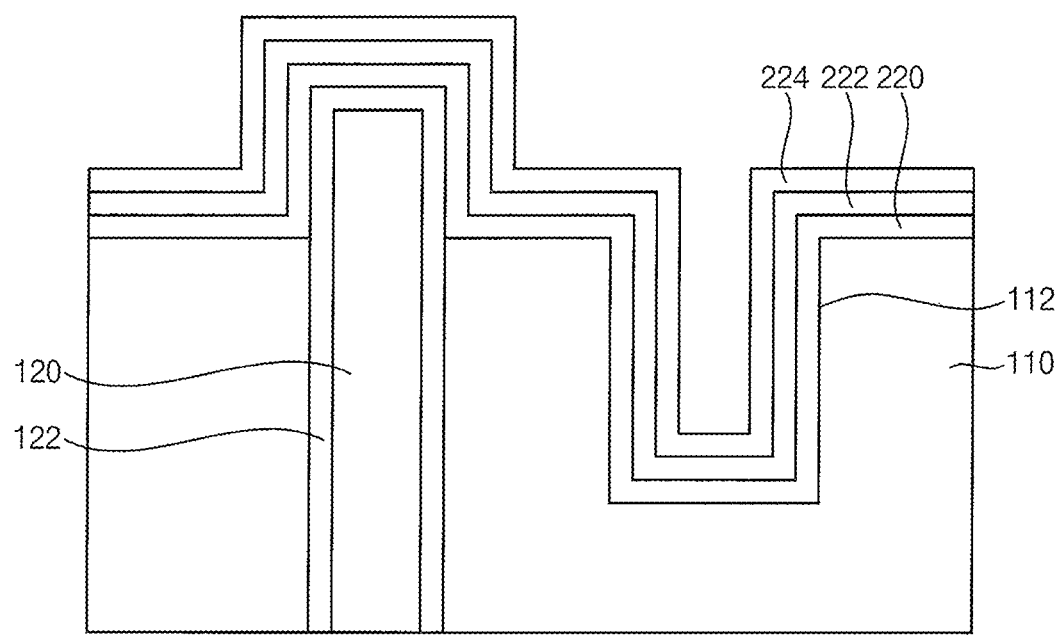

Referring to FIG. 7, the first insulation layer 220 may be formed on the upper surface of the semiconductor substrate 110. In an implementation, the first insulation layer 220 may be formed on the upper surface of the semiconductor substrate 110, the upper end of the TSV 120, and the inner surface of the trench 112. In an implementation, the first insulation layer 220 may include, e.g., an oxide.

The second insulation layer 222 may be formed on the first insulation layer 220. In an implementation, the second insulation layer 222 may be formed on the first insulation layer 220 in the trench 112. In an implementation, the second insulation layer 222 may include, e.g., silicon nitride.

The third insulation layer 224 may be formed on the second insulation layer 222. In an implementation, the third insulation layer 224 may be formed on the second insulation layer 222 in the trench 112. In an implementation, the third insulation layer 224 may include, e.g., an oxide.

Figure 8:
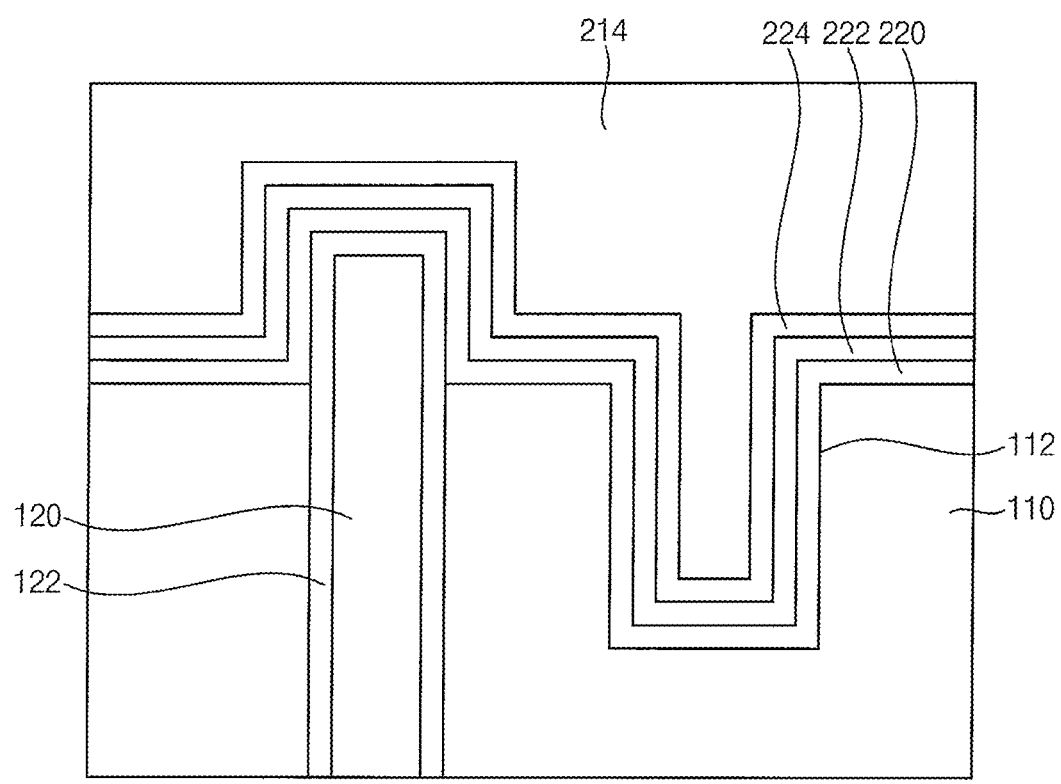

Referring to FIG. 8, a conductive layer 214 may be formed on the third insulation layer 224. In an implementation, remaining parts of the trench 112 may be filled with the conductive layer 214. In an implementation, the conductive layer 214 may include, e.g., copper.

Figure 9:
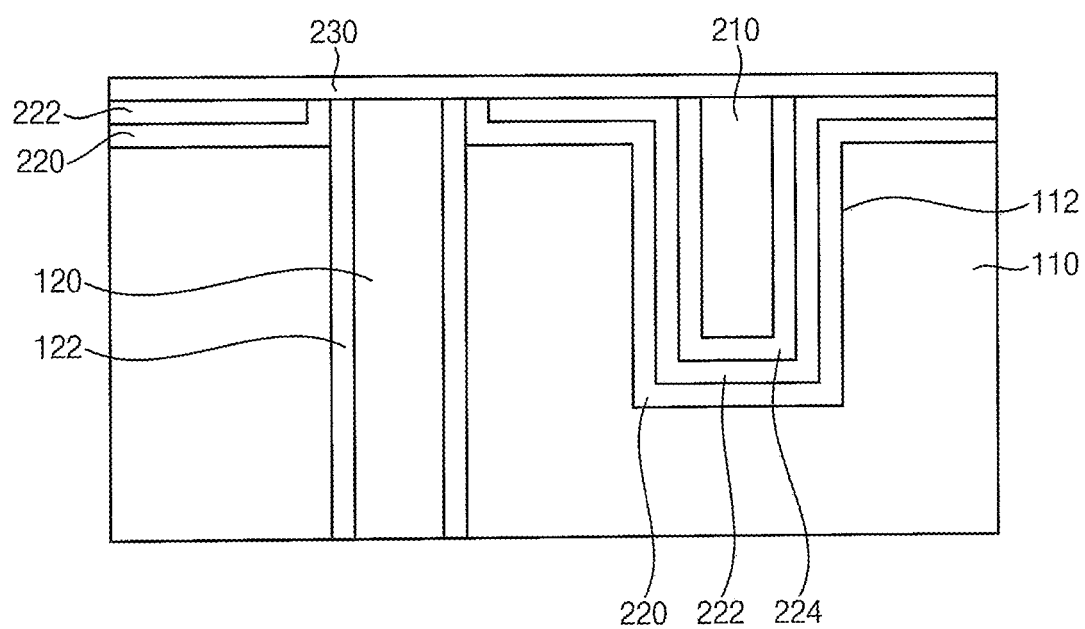

Referring to FIG. 9, portions of the conductive layer 214 may be removed until the second insulation layer 222 on the upper surface of the semiconductor substrate 110 may be exposed. In an implementation, a planarization process may be performed. The second insulation layer 222 may act as a stopping layer of the planarization process. In an implementation, the planarization process may include, e.g., a chemical mechanical polishing (CMP) process.

Portions of the end of the TSV 120 protruding from the surface of the semiconductor substrate 110, the third insulation layer 224 surrounding the end of the TSV 120, the second insulation layer 222, and the first insulation layer 220 may be removed by the planarization process. In an implementation, portions of the third insulation layer 224 on the surface of the semiconductor substrate 110 may be fully removed. In an implementation, only the first insulation layer 220 and the second insulation layer 222 may remain on the surface of the semiconductor substrate 110. In an implementation, the end of the TSV 120 may be exposed.

In an implementation, the planarization process may be performed until the second insulation layer 222 on the surface of the semiconductor substrate 110 is exposed. In an implementation, the portions of the conductive layer in the trench 112 may remain to form the thermal core 210 in the trench 112. A surface of the thermal core 210 may be exposed. In an implementation, the portions of the third insulation layer 224 in the trench 112 may also remain. In an implementation, the first insulation layer 220, the second insulation layer 222 and the third insulation layer 224 in the trench 112 may remain. In an implementation, the first insulation layer 220, the second insulation layer 222, and the third insulation layer 224 may be between the thermal core 210 and the inner surface of the trench 112 so that the thermal core 210 may be supported by the first to third insulation layers 220, 222 and 224.

The seed layer 230 may be formed on the surface of the semiconductor substrate 110. In an implementation, the seed layer 230 may be formed on the end of the TSV 120, the surface of the thermal core 210, and the surface of the second insulation layer 222.

Figure 10:
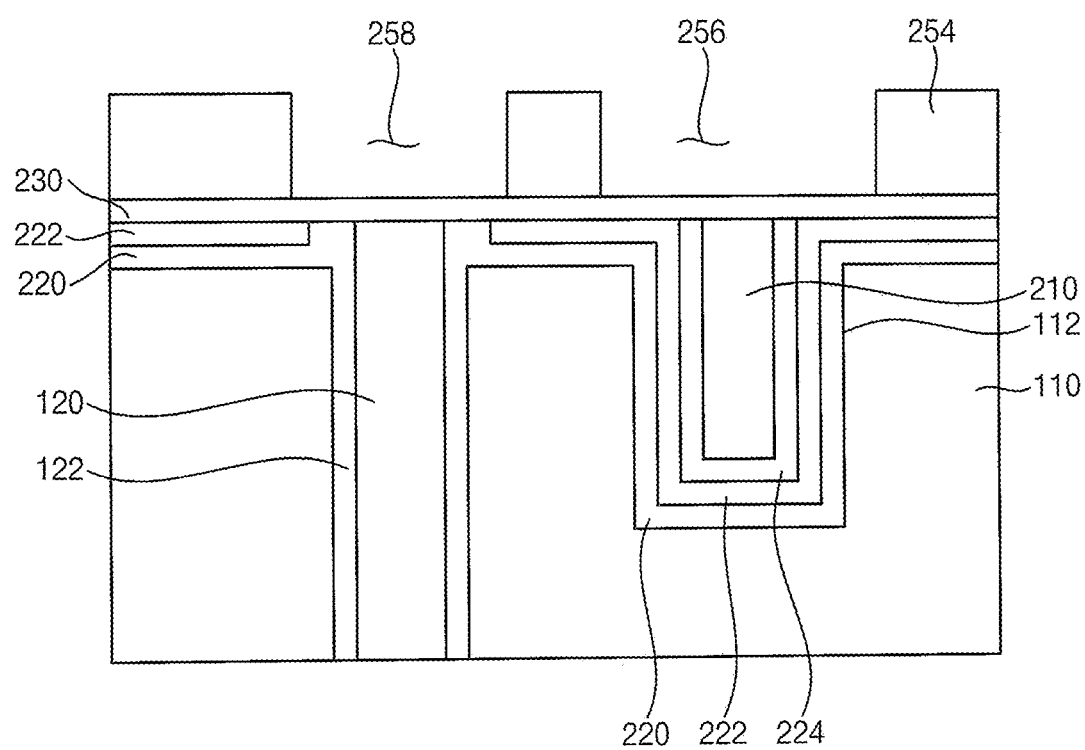

Referring to FIG. 10, a photoresist pattern 254 may be formed on the seed layer 230. The photoresist pattern 254 may have openings 256 and 258 exposing portions of the seed layer 230 on the end of the TSV 120 and the surface of the thermal core 210.

A plating process may be performed on the exposed portion of the seed layer 230 to form the head portion 124 on the TSV 120 and the thermal head 212 of the thermal pad 200. The photoresist pattern 254 may then be removed. A portion of the seed layer 230 exposed by the head portion 124 on the TSV 120 and the thermal head 212 may be removed to complete the semiconductor chip 100 in FIG. 3.

Figure 11:
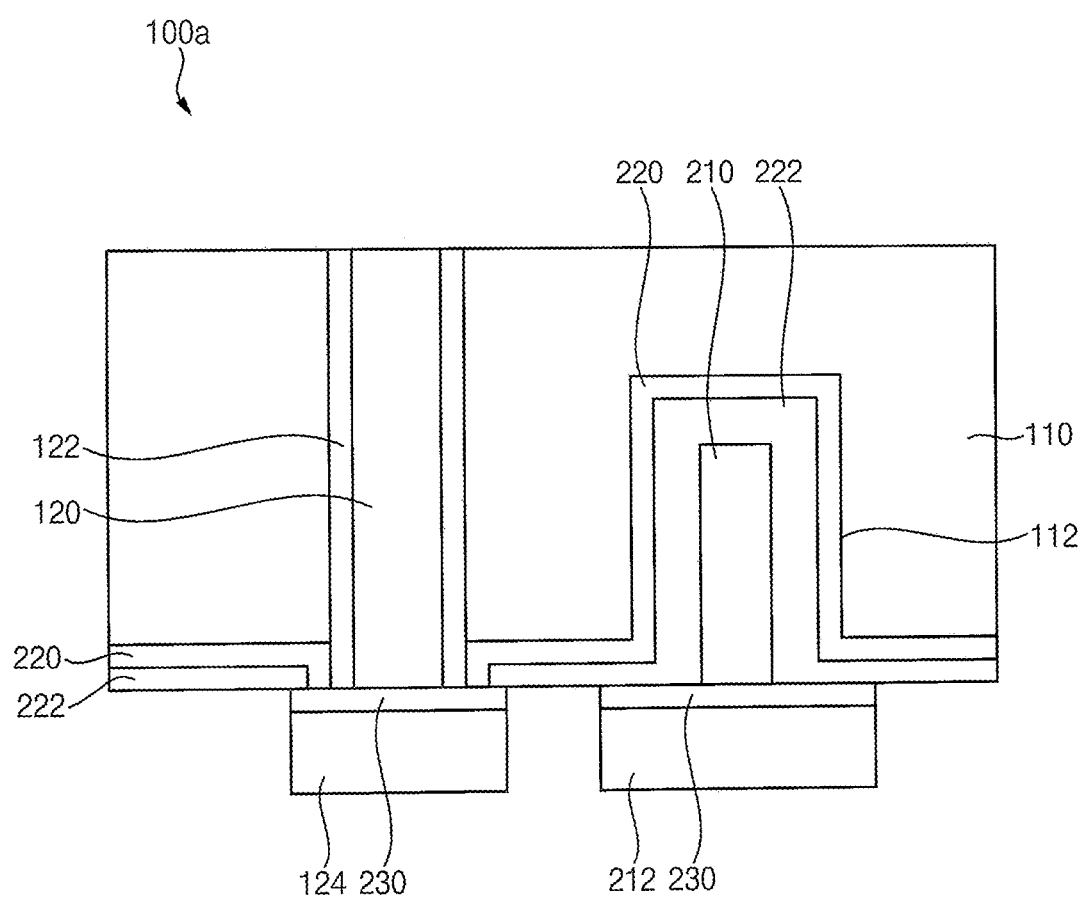
FIG. 11 is a cross-sectional view of a semiconductor chip in accordance with example embodiments.

FIG. 11 is a cross-sectional view of a semiconductor chip in accordance with example embodiments.

Referring to FIG. 11, a semiconductor chip 100a according to an embodiment may not include the third insulation layer 224 among the elements of the semiconductor chip 100 in FIG. 3. In an implementation, only the first and second insulation layers 220 and 222 may be included in the trench 112 (along with the thermal core 210). In an implementation, an inner surface of the second insulation layer 222 may directly contact an outer surface of the thermal core 210.

A method of manufacturing the semiconductor chip 100a may include processes substantially the same as those illustrated with reference to FIGS. 4 to 10 except for not including the process for forming the third insulation layer 224. Thus, any further illustrations with respect to the method of manufacturing the semiconductor chip 100a may be omitted herein for brevity.

Figure 12:
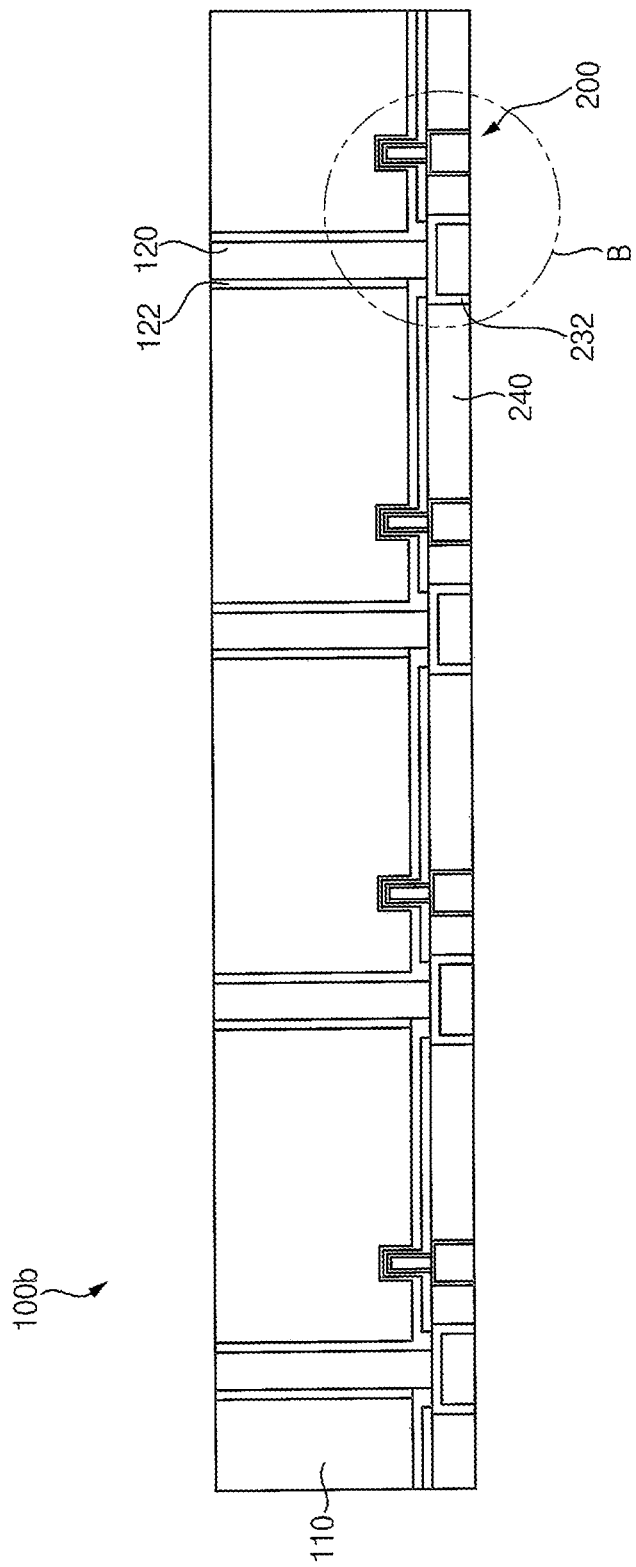
FIG. 12 is a cross-sectional view of a semiconductor chip in accordance with example embodiments.
Figure 13:
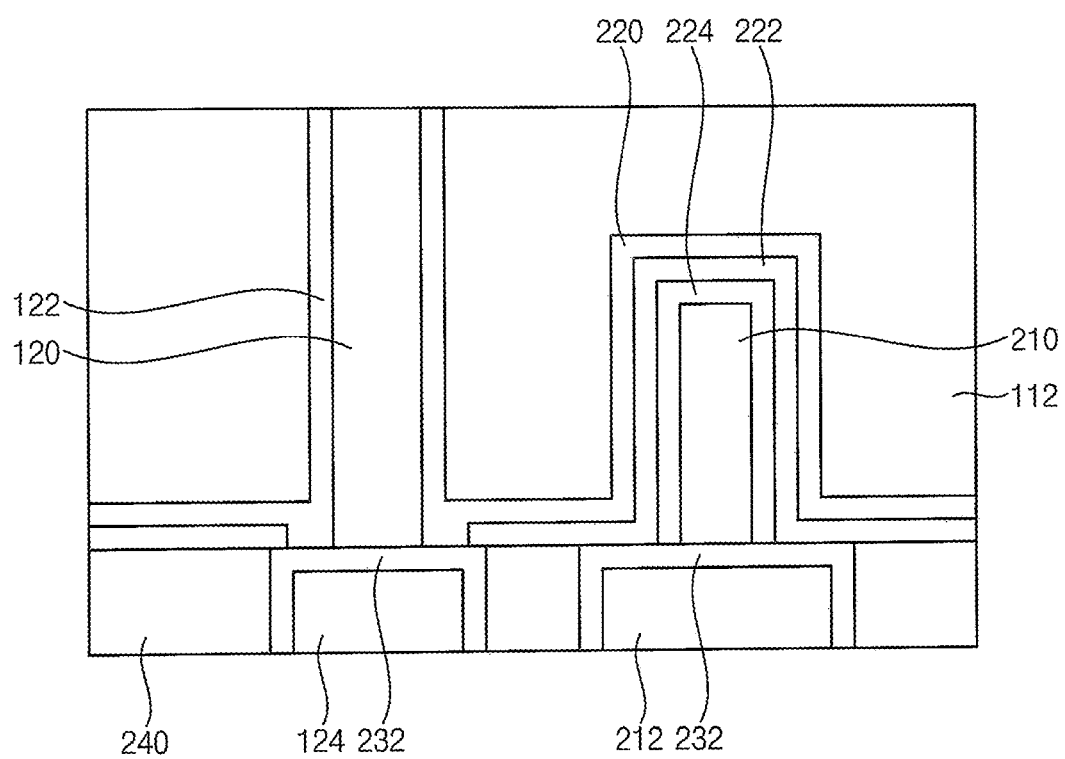
FIG. 13 is an enlarged cross-sectional view of a portion "B" in FIG. 12.

FIG. 12 is a cross-sectional view of a semiconductor chip in accordance with example embodiments and FIG. 13 is an enlarged cross-sectional view of a portion "B" in FIG. 12.

A semiconductor chip 100b according to an embodiment may include elements substantially the same as those of the semiconductor chip 100 in FIG. 3 except for further including a seed layer and a fourth insulation layer. Thus, the same reference numerals may refer to the same elements and any further illustrations with respect to the same elements may be omitted herein for brevity.

Referring to FIGS. 12 and 13, a plurality of the semiconductor chips 100b may be stacked. The TSVs 120 of the stacked semiconductor chip 100b may be directly connected with each other. In an implementation, the stacked semiconductor chip 100b may be electrically connected with each other by a hybrid bonding process.

The seed layer 232 may surround a side surface of the head portion 124 on the TSV 120 as well as the surface of the head portion 124 on the TSV 120 (e.g., between the TSV 120 and the head portion 124). In an implementation, only an upper, e.g., outer, surface of the head portion 124 on the TSV 120 may be exposed. In an implementation, the seed layer 232 may surround a side surface of the thermal head 212 as well as the lower surface of the thermal head 212 (e.g., between the thermal head 212 and the thermal core 210). In an implementation, only an upper, e.g., outer, surface of the thermal head 212 may be exposed.

The fourth insulation layer 240 may be on the second insulation layer 222 on the lower surface of the semiconductor substrate 110 and may surround the seed layer 232. In an implementation, the fourth insulation layer 240 may surround a portion of the seed layer 232 that contacts the side surface of the head portion 124 on the TSV 120. In an implementation, the fourth insulation layer 240 may surround a portion of the seed layer 232 that contacts the side surface of the thermal head 212. In an implementation, the fourth insulation layer 240 may have an upper surface substantially coplanar with the upper surfaces of the head portion 124 of the TSV 120 and the thermal head 212. In an implementation, the upper surfaces of the head portion 124 on the TSV 120 and the thermal head 212 may be exposed through the fourth insulation layer 240.

Figure 14:
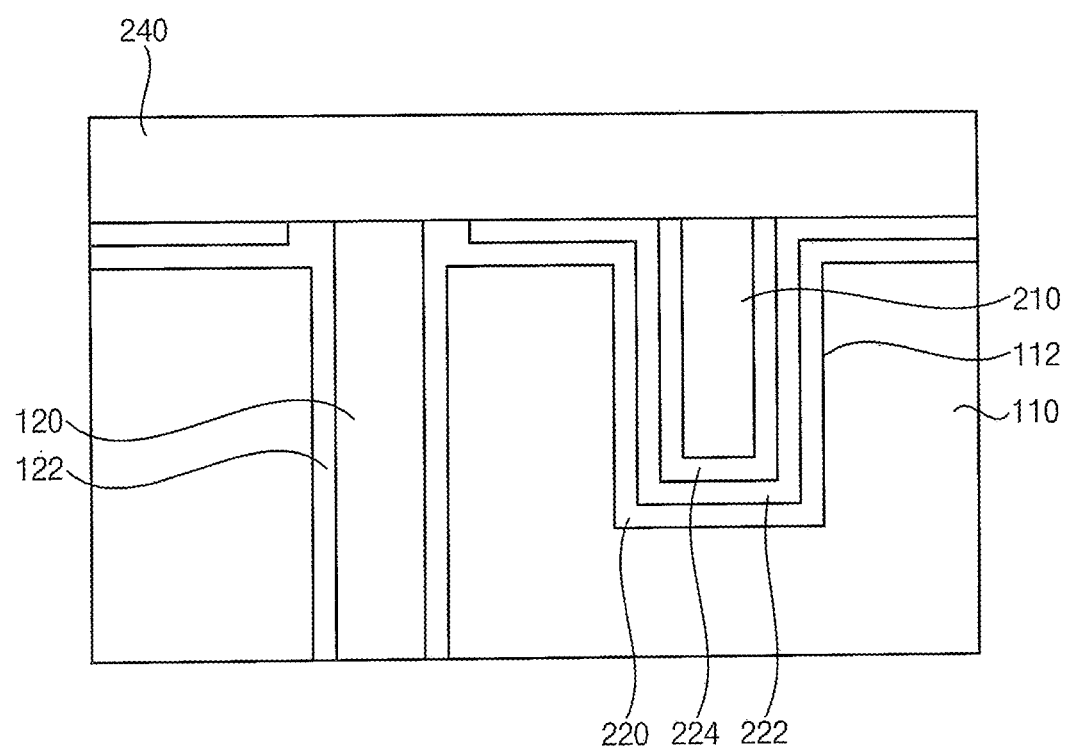
FIGS. 14 and 15 are cross-sectional views of stages in a method of manufacturing the semiconductor chip in FIG. 13.
Figure 15:
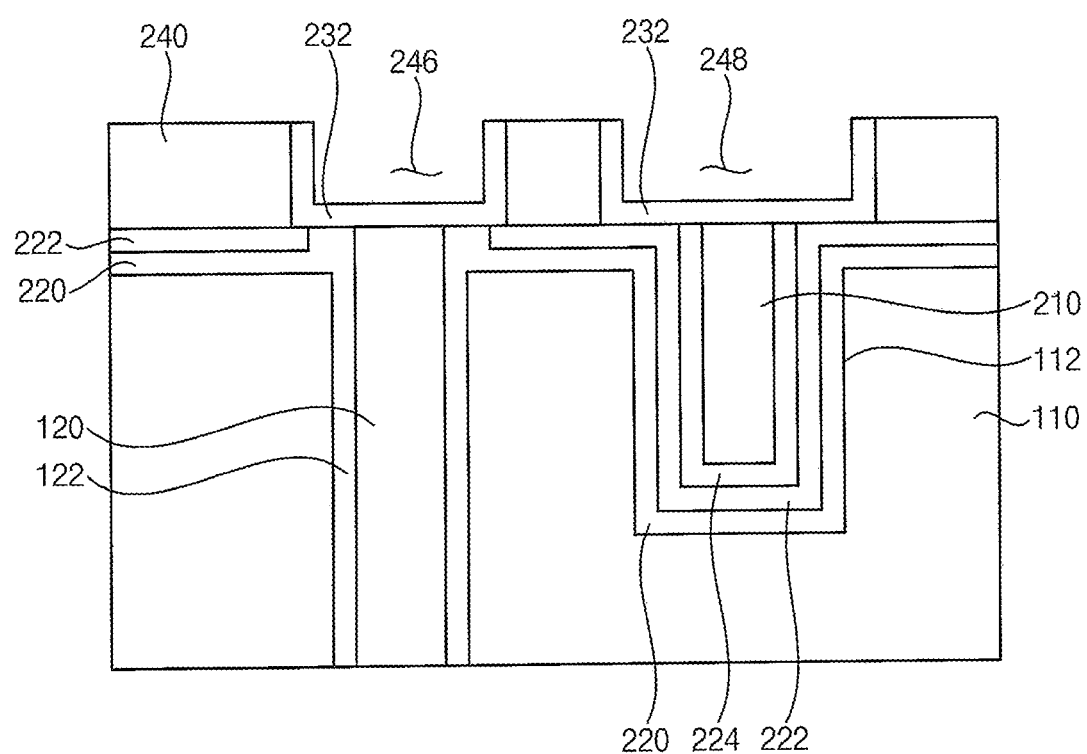

FIGS. 14 and 15 are cross-sectional views of stages in a method of manufacturing the semiconductor chip in FIG. 13.

Processes substantially the same as those illustrated with reference to FIGS. 4 to 8 may be performed. The conductive layer and the third insulation layer 224 may be removed until the second insulation layer 222 is exposed.

Referring to FIG. 14, the fourth insulation layer 240 may be formed on the second insulation layer 222. In an implementation, the fourth insulation layer 240 may include, e.g., an oxide.

Referring to FIG. 15, the fourth insulation layer 240 may be etched to form openings 246 and 248 exposing the surfaces of the TSV 120 and the thermal core 210.

The seed layer 232 may be formed on inner surfaces of the openings 246 and 248. In an implementation, the seed layer 232 may be formed on the surface of the TSV 120, the surface of the thermal core 210, and other inner surfaces of the openings 246 and 248.

A plating process may be performed on the seed layer 232 to form the head portion 124 on the TSV 120 and the thermal head 212 of the thermal pad 200, thereby completing the semiconductor chip 100b in FIG. 13.

Figure 16:
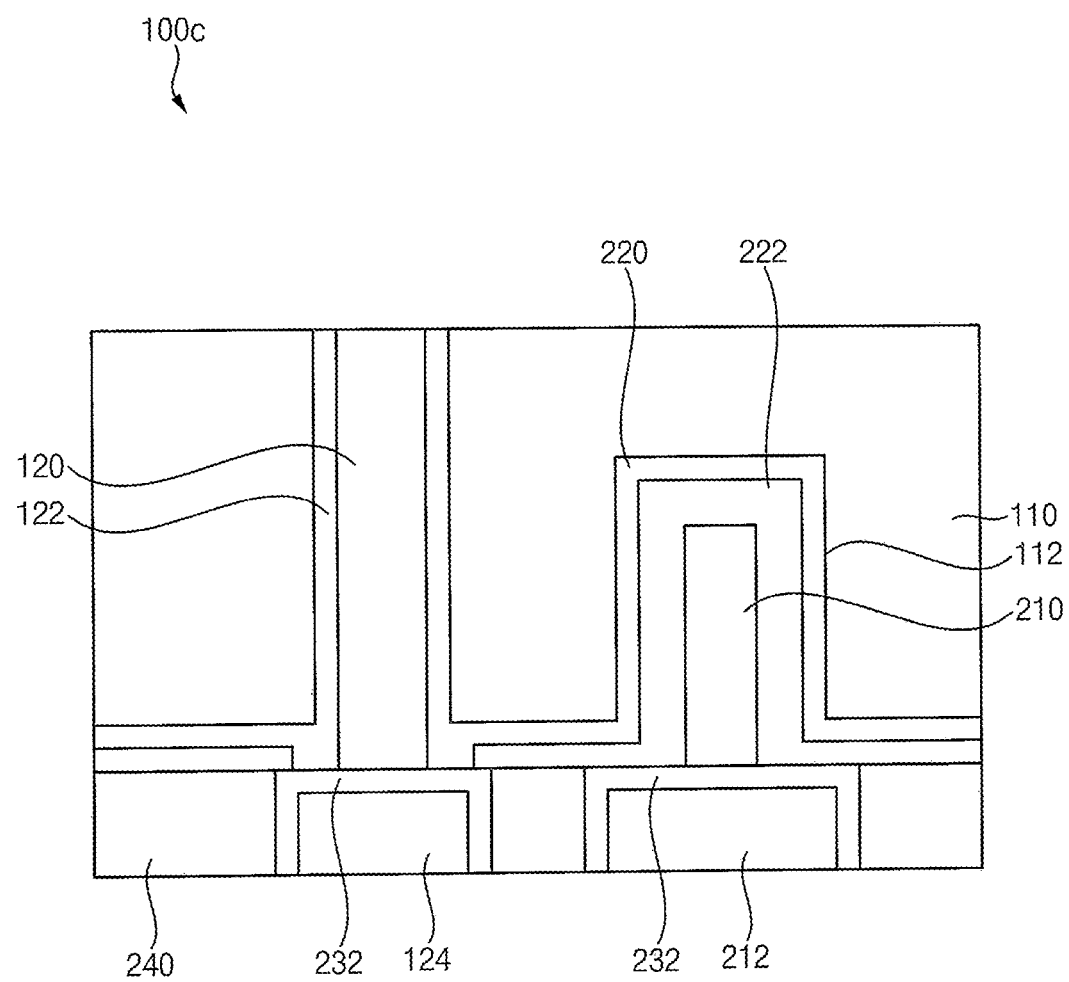
FIG. 16 is a cross-sectional view of a semiconductor chip in accordance with example embodiments.

FIG. 16 is a cross-sectional view of a semiconductor chip in accordance with example embodiments.

Referring to FIG. 16, a semiconductor chip 100c according to an embodiment may not include the third insulation layer 224 among the elements of the semiconductor chip 100b in FIG. 13. In an implementation, only the first and second insulation layers 220 and 222 may be included in the trench 112 (e.g., along with the thermal core 210). In an implementation, an inner surface of the second insulation layer 222 may directly contact an outer surface of the thermal core 210.

A method of manufacturing the semiconductor chip 100c may include processes substantially the same as those illustrated with reference to FIGS. 14 and 15 except for not including the process for forming the third insulation layer 224. Thus, any further illustrations with respect to the method of manufacturing the semiconductor chip 100c may be omitted herein for brevity.

Figure 17:
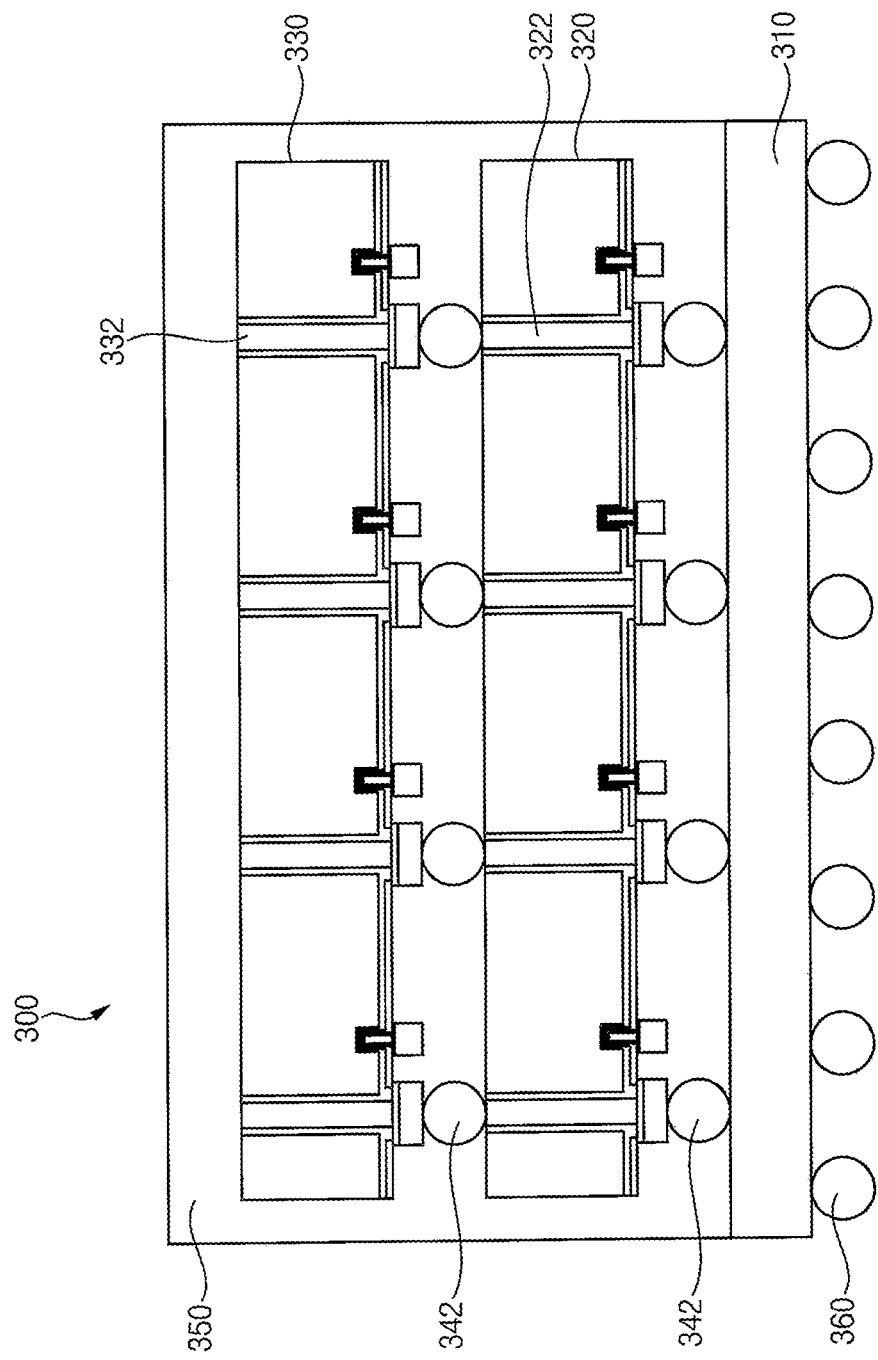
FIG. 17 is a cross-sectional view of a multi-chip package including the semiconductor chip in FIG. 1.

FIG. 17 is a cross-sectional view of a multi-chip package including the semiconductor chip in FIG. 1.

Referring to FIG. 17, a multi-chip package 300 according to an embodiment may include a package substrate 310, a first semiconductor chip 320, a second semiconductor chip 330, a molding member 350, and external terminals 360. The first semiconductor chip 320 may be on an upper surface of the package substrate 310. The second semiconductor chip 330 may be stacked on an upper surface of the first semiconductor chip 320.

The first and second semiconductor chips 320 and 330 may have a structure substantially the same as the structure of the semiconductor chip 100 in FIG. 1. Thus, the same reference numerals may refer to the same elements and any further illustrations with respect to the same elements may be omitted herein for brevity.

The first semiconductor chip 320 may include a first TSV 322. The first TSV 322 may have a structure substantially the same as the structure of the TSV 120 in FIG. 1. The second semiconductor chip 330 may include a second TSV 332. The second TSV 332 may have a structure substantially the same as the structure of the TSV 120 in FIG. 1. Thus, and any further illustrations with respect to the first and second TSVs 322 and 332 may be omitted herein for brevity.

A first conductive bump 340 may be between the package substrate 310 and the first semiconductor chip 320. In an implementation, the first conductive bump 340 may be connected to a lower end of the first TSV 322, e.g., through a head portion on the first TSV 322. The first conductive bump 340 may be connected to a pad on the upper surface of the package substrate 310. In an implementation, the package substrate 310 and the first semiconductor chip 320 may be electrically connected with each other via the first conductive bump 340.

A second conductive bump 342 may be between the first semiconductor chip 320 and the second semiconductor chip 330. In an implementation, the second conductive bump 342 may be connected to an end of the first TSV 322. The second conductive bump 342 may be connected to an end of the second TSV 332, e.g., through a head portion on the second TSV 332. In an implementation, the first semiconductor chip 320 and the second semiconductor chip 330 may be electrically connected with each other via the second conductive bump 342.

The molding member 350 may be formed on the upper surface of the package substrate 310 to cover the first semiconductor chip 320 and the second semiconductor chip 330. The molding member 350 may include, e.g., an epoxy molding compound (EMC).

The external terminals 360 may be mounted on a lower surface of the package substrate 310. The external terminals 360 may include, e.g., solder balls.

Figure 18:
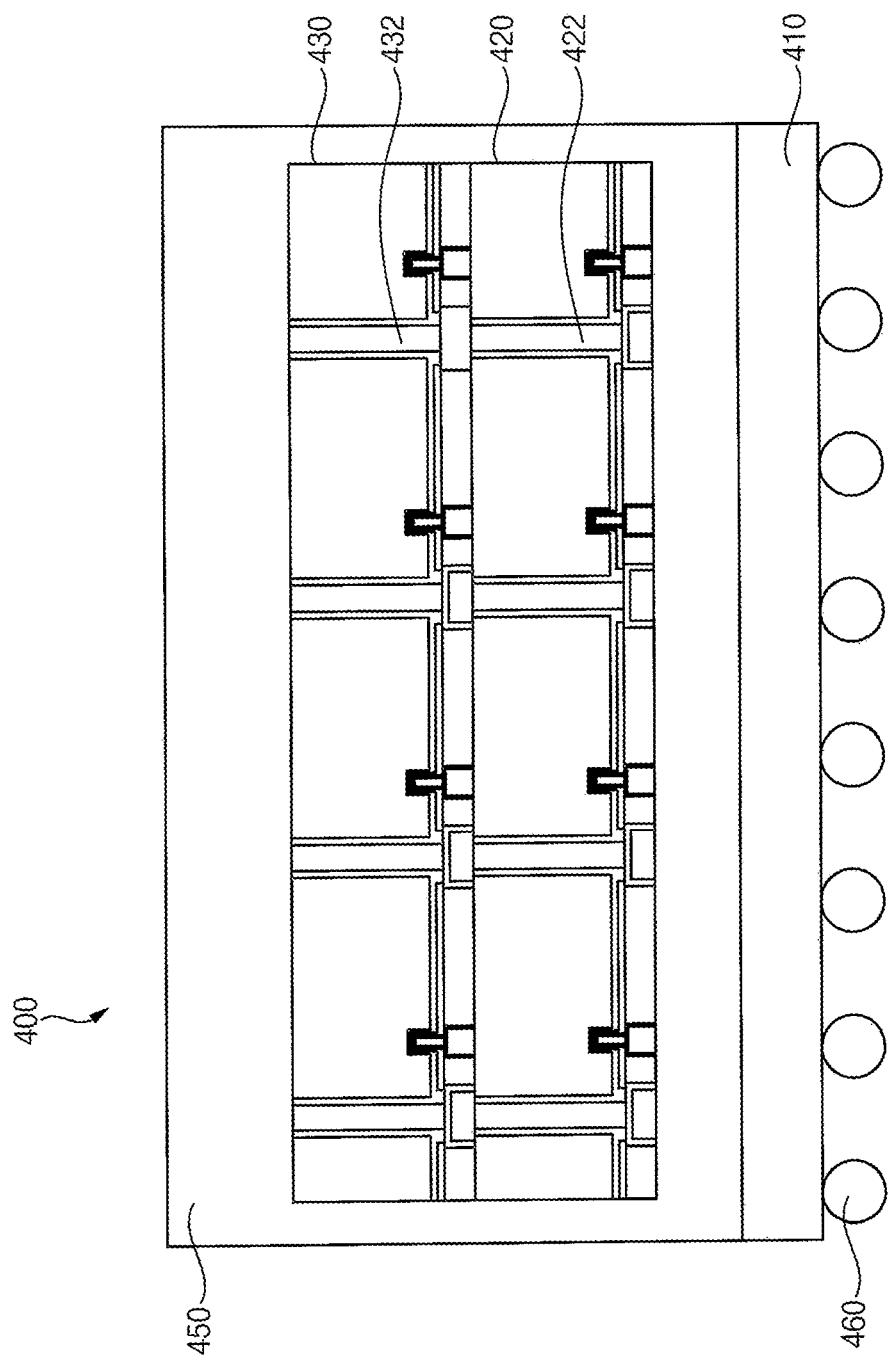
FIG. 18 is a cross-sectional view of a multi-chip package including the semiconductor chip in FIG. 12.

FIG. 18 is a cross-sectional view of a multi-chip package including the semiconductor chip in FIG. 12.

Referring to FIG. 18, a multi-chip package 400 according to an embodiment may include a package substrate 410, a first semiconductor chip 420, a second semiconductor chip 430, a molding member 450, and external terminals 460. The first semiconductor chip 420 may be on an upper surface of the package substrate 410. The second semiconductor chip 430 may be stacked on an upper surface of the first semiconductor chip 420.

The first and second semiconductor chips 420 and 430 may have a structure substantially the same as the structure of the semiconductor chip 100 in FIG. 1. Thus, the same reference numerals may refer to the same elements and any further illustrations with respect to the same elements may be omitted herein for brevity.

The first semiconductor chip 420 may include a first TSV 422. The first TSV 422 may have a structure substantially the same as the structure of the TSV 120 in FIG. 1. The second semiconductor chip 430 may include a second TSV 432. The second TSV 432 may have a structure substantially the same as the structure of the TSV 120 in FIG. 1. Thus, and any further illustrations with respect to the first and second TSVs 422 and 432 may be omitted herein for brevity.

A head portion on the first TSV 422 may be directly connected to a pad of the package substrate 410. In an implementation, the head portion on the first TSV 422 may directly contact the pad of the package substrate 410 by a hybrid bonding process. In an implementation, a gap may not be formed between the package substrate 410 and the first semiconductor chip 420.

A head portion on the second TSV 432 may be directly connected to an end of the first TSV 422. In an implementation, the head portion on the second TSV 432 may directly contact the upper end of the first TSV 422 by a hybrid bonding process. In an implementation, a gap may not be formed between the first semiconductor chip 420 and the second semiconductor chip 430.

The hybrid bonding process may include a dangling process and an annealing process. The dangling process may include contacting a lower surface of the second semiconductor chip 430 with the upper surface of the first semiconductor chip 420 to dangling-bond silicones in the first and second semiconductor chips 420 and 430 to each other. The annealing process may include applying heat to the first and second semiconductor chips 420 and 430 to expand the pad of the package substrate 410, the first TSV 422, and the second TSV 432, thereby covalently bonding the pad of the package substrate 410, the first TSV 422, and the second TSV 432 to each other.

The molding member 450 may be formed on the upper surface of the package substrate 410 to cover the first semiconductor chip 420 and the second semiconductor chip 430. The molding member 350 may include an epoxy molding compound (EMC).

The external terminals 460 may be mounted on a lower surface of the package substrate 410. The external terminals 360 may include solder balls.

According to an embodiment, the first insulation layer and the second insulation layer may be between the inner surface of the trench and the thermal core to help reinforce a structure of the thermal pad. Thus, the thermal pad may help effectively dissipate the heat in the TSV.

In an implementation, the double or triple structural insulation layers may be included between the inner surface of the trench and the thermal core to help reinforce the structure of the thermal pad. Thus, the thermal pad may more effectively dissipate the heat in the TSV.

By way of summation and review, heat may be generated from a TSV. The heat could deteriorate circuits in the semiconductor chip.

In order to dissipate the heat, a thermal pad may be arranged on a semiconductor substrate. The thermal pad may be on a lower surface of the semiconductor substrate. The thermal pad could have a weak structure to have low heat dissipation capacity.

One or more embodiments may provide a thermal pad configured to dissipate heat in a TSV extending through a semiconductor chip.

One or more embodiments may provide a thermal pad that may be capable of effectively dissipating heat in a TSV.

According to example embodiments, the first insulation layer and the second insulation layer may be between the inner surface of the trench and the thermal core to help reinforce a structure of the thermal pad. Thus, the thermal pad may effectively dissipate the heat in the TSV.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thermal pad of a semiconductor chip, the thermal pad comprising:
   a thermal core in a trench at a lower surface of a semiconductor substrate, the thermal core being configured to receive heat generated from a through silicon via (TSV) vertically extending through the semiconductor substrate;
   a thermal head connected to the thermal core and protruding from the lower surface of the semiconductor substrate, the thermal head being configured to dissipate the heat in the thermal core;
   a first insulation layer between an inner surface of the trench and the thermal core and extending onto the lower surface of the semiconductor substrate;
   a second insulation layer between the first insulation layer and the thermal core extending onto the lower surface of the semiconductor substrate;
   a third insulation layer entirely within the trench between the second insulation layer and the thermal core; and
   a seed layer interposed between the thermal core and the thermal head, the seed layer surrounding a side surface and a lower surface of the thermal head and exposing only an upper surface of the thermal head.

2. The thermal pad as claimed in claim 1, wherein the first insulation layer includes an oxide.

3. The thermal pad as claimed in claim 1, wherein the second insulation layer includes silicon nitride.

4. The thermal pad as claimed in claim 1, wherein the third insulation layer includes an oxide.

5. A semiconductor chip comprising:
   a semiconductor substrate including a trench at a lower surface thereof;
   a through silicon via (TSV) vertically extending through the semiconductor substrate;
   a thermal core in the trench, the thermal core being configured to receive heat generated from the TSV;
   a thermal head connected to the thermal core and protruding from the lower surface of the semiconductor substrate, the thermal head being configured to dissipate the heat in the thermal core;
   a first insulation layer between an inner surface of the trench and the thermal core and extending onto the lower surface of the semiconductor substrate;
   a second insulation layer between the first insulation layer and the thermal core extending onto the lower surface of the semiconductor substrate;
   a third insulation layer entirely within the trench between the second insulation layer and the thermal core; and
   a seed layer interposed between the thermal core and the thermal head, the seed layer surrounding a side surface and a lower surface of the thermal head and exposing only an upper surface of the thermal head.

6. The semiconductor chip as claimed in claim 5, wherein the seed layer extends to side surfaces of the thermal head.

7. The semiconductor chip as claimed in claim 5, further comprising a head portion protruding from the lower surface of the semiconductor substrate on the TSV.

8. The semiconductor chip as claimed in claim 7, further comprising a seed layer between the TSV and the head portion.

9. The semiconductor chip as claimed in claim 7, further comprising a fourth insulation layer on the lower surface of the semiconductor substrate and surrounding the head portion and the thermal head.

* * * * *